United States Patent
Wei

(10) Patent No.: US 9,508,474 B2
(45) Date of Patent: Nov. 29, 2016

(54) METHOD FOR MANUFACTURING ANTICORROSIVE THIN FILM RESISTOR AND STRUCTURE THEREOF

(71) Applicant: Shih-Long Wei, New Taipei (TW)

(72) Inventor: Shih-Long Wei, New Taipei (TW)

(*) Notice: Subject to any disclaimer, the term of this patent is extended or adjusted under 35 U.S.C. 154(b) by 106 days.

(21) Appl. No.: 14/597,234

(22) Filed: Jan. 15, 2015

(65) Prior Publication Data

US 2016/0211058 A1   Jul. 21, 2016

(51) Int. Cl.
| | |
|---|---|
| *H01C 1/012* | (2006.01) |
| *H01C 7/00* | (2006.01) |
| *H01C 17/12* | (2006.01) |
| *H01C 1/142* | (2006.01) |
| *C23C 14/00* | (2006.01) |
| *C23C 14/06* | (2006.01) |
| *C23C 14/08* | (2006.01) |
| *C23C 14/10* | (2006.01) |

(52) U.S. Cl.
CPC ............ *H01C 7/006* (2013.01); *C23C 14/0036* (2013.01); *C23C 14/0652* (2013.01); *C23C 14/083* (2013.01); *C23C 14/10* (2013.01); *H01C 1/142* (2013.01); *H01C 17/12* (2013.01)

(58) Field of Classification Search
CPC ........ H01C 7/00; H01C 7/006; H01C 17/12; H01C 1/142; H01C 7/022; H01C 7/043
USPC ....................................................... 338/308
See application file for complete search history.

(56) References Cited

U.S. PATENT DOCUMENTS

| 4,288,776 A * | 9/1981 | Holmes | H01C 1/034 219/121.68 |
|---|---|---|---|
| 4,296,309 A * | 10/1981 | Shinmi | H01C 7/006 219/543 |
| 4,368,252 A * | 1/1983 | Kakuhashi | H01C 7/22 156/151 |
| 5,444,475 A * | 8/1995 | Mitani | B41J 2/33515 347/200 |
| 5,790,154 A * | 8/1998 | Mitani | B41J 2/14129 257/537 |
| 7,170,389 B2 * | 1/2007 | Vincent | H01C 17/12 338/22 R |
| 2008/0122035 A1 * | 5/2008 | Watanabe | H01C 7/006 257/536 |

\* cited by examiner

*Primary Examiner* — Kyung Lee
(74) *Attorney, Agent, or Firm* — Leong C. Lei

(57) ABSTRACT

Disclosed are a method for manufacturing an anticorrosive thin film resistor and a structure thereof, which includes a thin film resistor and a protection layer formed on the thin film resistor. The method uses one of silicon (Si) or tantalum (Ta) to serve as a film coating target and, during a process of reactive sputtering, mixes reactive oxygen or nitrogen with a discharge gas so as to coat a thin film on the thin film resistor with the operation temperature of the reactive sputtering process controlled between 100° C.-500° C. As such, the film coating target is passivated to form an anticorrosive protection layer having a thickness of at least 1 μm to prevent change of electrical property of the resistor resulting from electrolytic corrosion.

7 Claims, 4 Drawing Sheets

METHOD FOR MANUFACTURING ANTICORROSIVE THIN FILM RESISTOR AND STRUCTURE THEREOF

TECHNICAL FIELD OF THE INVENTION

The present invention generally relates to a method for manufacturing an anticorrosive thin film resistor and a structure thereof, and more particularly to a method for manufacturing an anticorrosive thin film resistor and a structure thereof, which protect the thin film resistor from influences caused by high temperature of a manufacturing process on the electrical property thereof and achieve an extended period of time for protection of the resistor from electrolytic corrosion.

DESCRIPTION OF THE PRIOR ART

Thin film resistors have been widely used. For applications where a surface area is extremely greater than thickness, such as thin film physics or semiconductor industry, it is often necessary to deposit a film having a thickness of a nanometer size on a chip. A conventional thin film resistor is formed of sputtering of resistive materials, such as a resistor alloy target made of a metal compound of for example nickel, chromium, silicon, aluminum, manganese, and copper. A resistance layer of the resistor so made often undergoes electrolytic corrosion due to long staying in an environment of high temperature and high humidity and being loaded with electrical potential, so that quality change of the electrical resistance may occur or open circuiting may result.

Further, in order to overcome electrolytic corrosion of the resistor, a conventional solution is to coat a layer of insulation material, such as epoxy resin or a polymer material, on a surface of the resistance layer to provide protection against corrosion. However, after a long period of time of use, electrolytic corrosion may still possibly occur, eventually leading to variation of electrical property thereof, such as electrical resistance and temperature, or even open circuiting.

Apparently, the conventional way of manufacturing a thin film resistor suffers the following drawbacks and problems that require further improvement:

(1) A resistance layer made of sputtering resistive material does not includes an anticorrosive protection layer so that electrolytic corrosion may easily occur.

(2) There is still a potential risk of open circuiting after a long term of use even a protection layer formed of an insulation material coated on a surface of the resistance layer.

Thus, it is a challenge of the present inventor and those involved in this industry to provide a solution to overcome such drawbacks and problems of the prior art.

SUMMARY OF THE INVENTION

The present invention aims to provide a method for manufacturing an anticorrosive thin film resistor and a structure thereof, which offers long-term protection of a thin film resistor against electrical property change caused by electrolytic corrosion.

The primary object of the present invention is that one of silicon (Si) and tantalum (Ta) is selected to serve as a film coating target and reactive oxygen or nitrogen gas is mixed with a discharge gas for use in a reactive sputtering process so as to coat a thin film having a thickness that is at least one micrometer on a thin film resistor with an operation temperature of the reactive sputtering controlled between 100° C.-500° C. to thereby passivate the film coating target to form a protection layer having the property of resisting corrosion.

To achieve the above object, the present invention provides a structure that comprises a thin film resistor and a protection layer formed on the thin film resistor. The protection layer is formed of a film coating target of at least one silicon (Si) or tantalum (Ta). When coating of a film to form the protection layer of the thin film resistor is performed by conducting a reactive sputtering operation, under the conditions that one of silicon (Si) and tantalum (Ta) serves as the film coating target and oxygen or nitrogen gas is mixed with a discharge gas and the sputtering temperature is controlled between 100° C.-500° C., the film coating target is passivated to form a protection layer having the property of resisting corrosion. As such, variation of electrical property of the thin film resistor resulting from electrolytic corrosion can be prevented. Further, the protection layer is composed of an oxide of silicon (Si), a nitride of silicon (Si), or an oxide of tantalum (Ta) and may offer a long period of time of protection, which when compared with a conventional protection layer made of an insulation material, such as epoxy resin, can provide protection for an extended period of time to effectively alleviate the above-discussed issues of drawbacks occurring in the resistor.

With the above-described technique, the problems of a conventional way of manufacturing a thin film resistor that the protection layer cannot be long effective to resist corrosion or even no protection layer is provided so as to lead to variation of electrical property resulting from electrolytic corrosion can be overcome and practical advantages can be achieved.

The foregoing objectives and summary provide only a brief introduction to the present invention. To fully appreciate these and other objects of the present invention as well as the invention itself, all of which will become apparent to those skilled in the art, the following detailed description of the invention and the claims should be read in conjunction with the accompanying drawings. Throughout the specification and drawings identical reference numerals refer to identical or similar parts.

Many other advantages and features of the present invention will become manifest to those versed in the art upon making reference to the detailed description and the accompanying sheets of drawings in which a preferred structural embodiment incorporating the principles of the present invention is shown by way of illustrative example.

DETAILED DESCRIPTION OF THE PREFERRED EMBODIMENTS

The following descriptions are exemplary embodiments only, and are not intended to limit the scope, applicability or configuration of the invention in any way. Rather, the following description provides a convenient illustration for implementing exemplary embodiments of the invention. Various changes to the described embodiments may be made in the function and arrangement of the elements described without departing from the scope of the invention as set forth in the appended claims.

Figure 1:
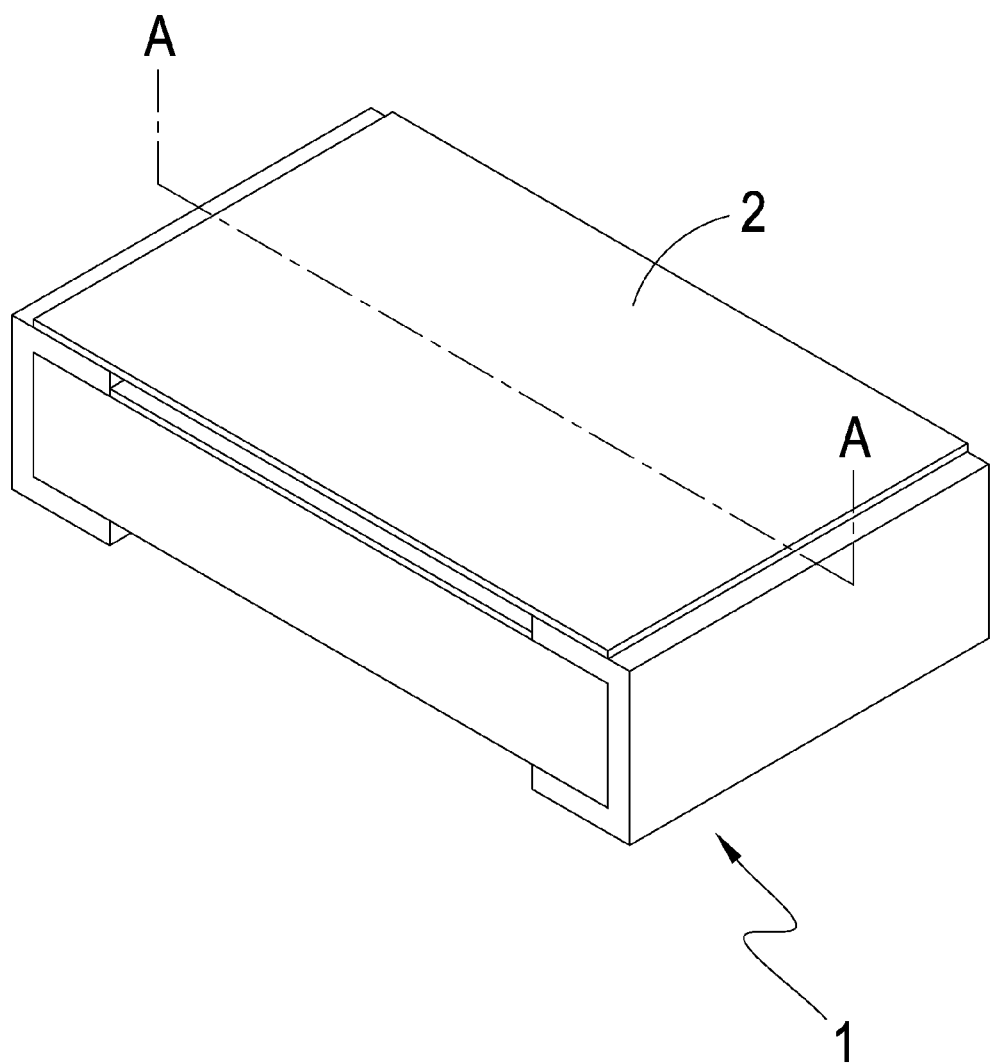
FIG. 1 is a perspective view showing a thin film resistor according to a preferred embodiment of the present invention.
Figure 2:
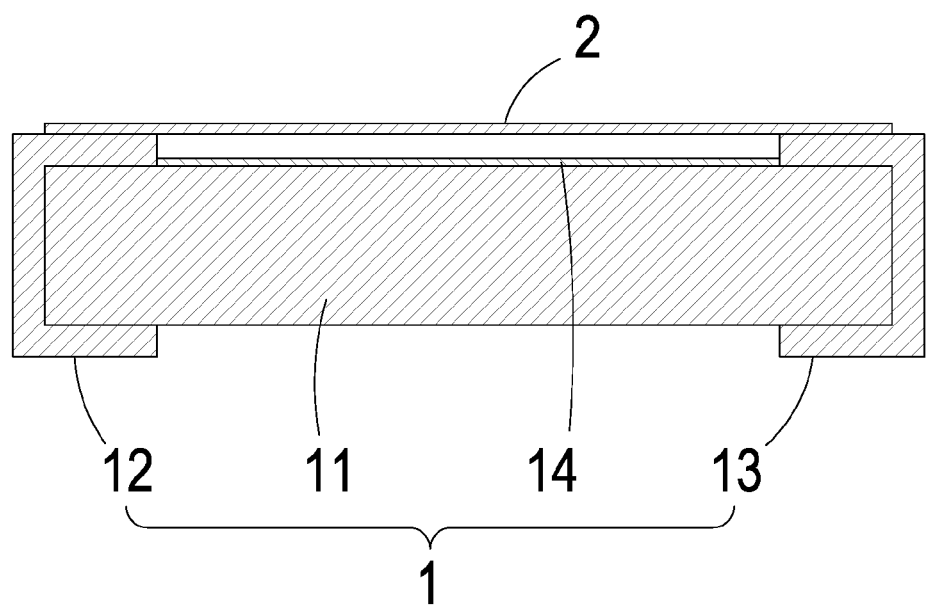
FIG. 2 is a cross-sectional view of the present invention taken along line A-A of FIG. 1.
Figure 3:
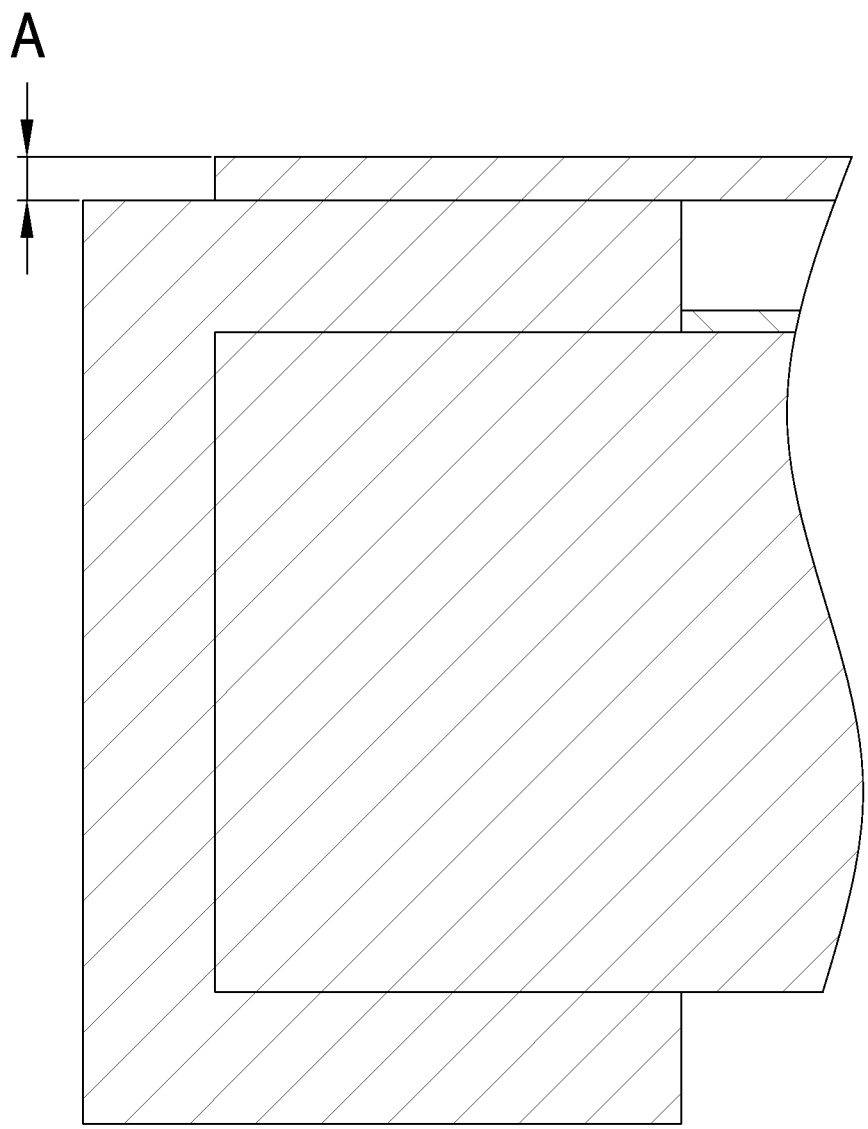
FIG. 3 is an enlarged view of a portion of the preferred embodiment of the present invention.
Figure 4:
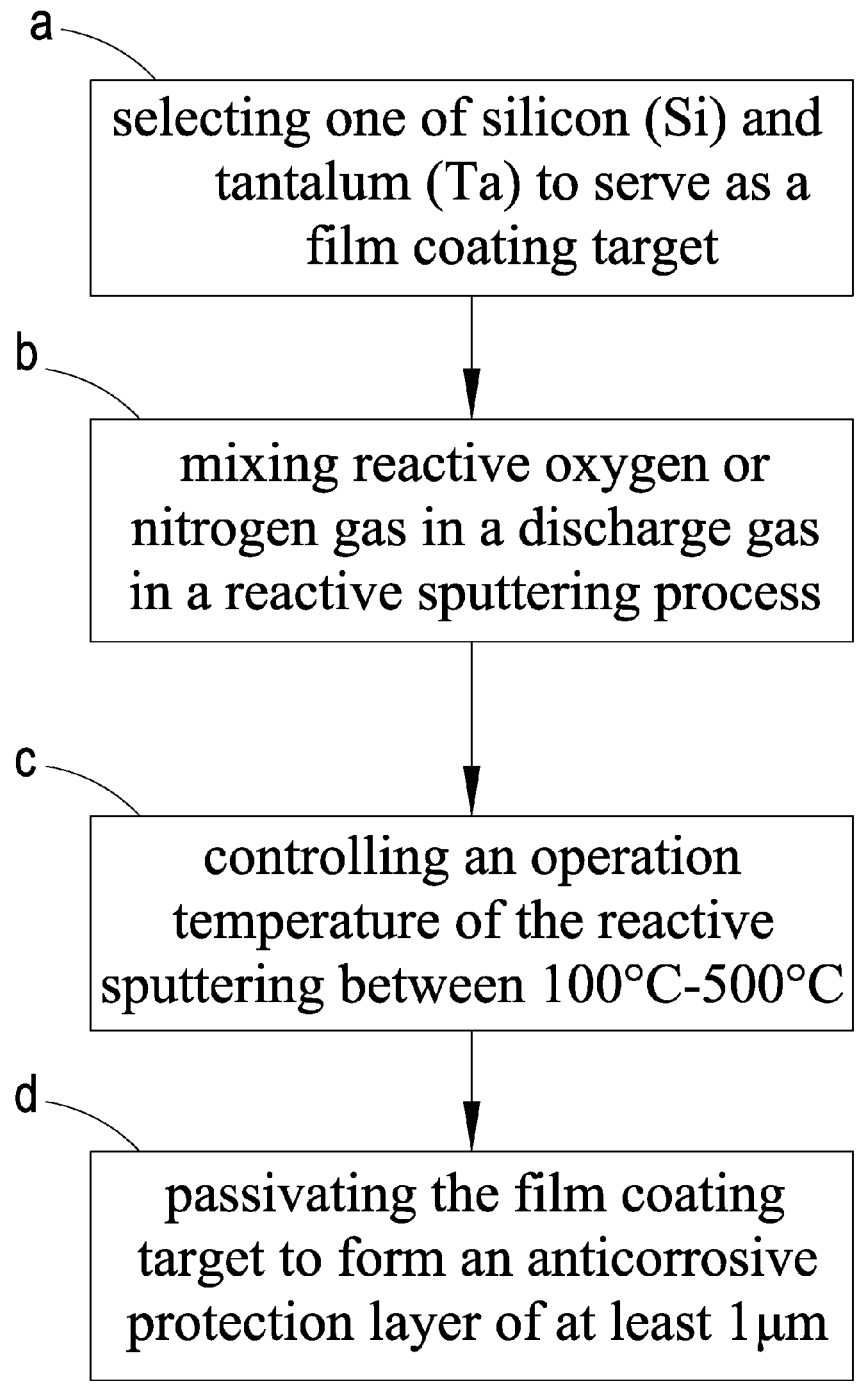
FIG. 4 is a flow chart illustrating a method according to the preferred embodiment of the present invention.

Referring to FIGS. 1 and 2, which are respectively a perspective view showing a thin film resistor according to a preferred embodiment of the present invention and a cross-sectional view taken along line A-A of FIG. 1, it can be clearly seen from these drawings that a manufacturing method according to the present invention and the steps thereof are as follows:

(a) selecting one of silicon (Si) and tantalum (Ta) to serve as a film coating target;

(b) mixing reactive oxygen or nitrogen gas in a discharge gas in a reactive sputtering process;

(c) controlling an operation temperature of the reactive sputtering between 100° C.-500° C.; and (d) passivating the film coating target to form an anticorrosive protection layer 2 on a thin film resistor 1.

Referring collectively to FIGS. 1-4, which are respectively a perspective view showing a thin film resistor according to a preferred embodiment of the present invention, a cross-sectional view taken along line A-A of FIG. 1, an enlarged view of a portion of the preferred embodiment of the present invention, and a flow chart illustrating a method according to the present invention, it can be clearly seen from these drawings that in the above-discussed manufacturing steps, a reactive sputtering operation is conducted to formed a coating film on the thin film resistor 1. The reactive sputtering operation used here is a type of vacuum sputtering. In the sputtering of a chemical compound film, if the chemical compound is applied directly as a target material, the film formed through the sputtering would be of a great difference in composition from the target material so that it is common, in sputtering of a chemical compound, to mix a reactive gas with a discharge gas in order to control the composition and property of the chemical compound film so formed. Such a sputtering process is referred to as reactive sputtering. In the operation of such a process, the control parameters include time, temperature, and material ratio, among which temperature and material used are of vital importance. A generally used operation environment for sputtering is between 200° C.-800° C. and to achieve a nanometer level, at least or beyond 500° C. must be used. However, for a thin film resistor 1 manufactured with such a high temperature, one of the important characteristics thereof, namely electrical resistance, often shows a deviation of 5-10% and thus other issues regarding electrical property deriving from such an error may also result. Thus, the present invention provides a manufacturing method that uses reactive sputtering, in which one of silicon (Si) or tantalum (Ta) is used as the film coating target and during the operation of reactive sputtering, reactive oxygen or nitrogen gas is introduced with gas flow rate being carefully monitored so that the forming speed of a compound film is substantially corresponding to the forming speed of a metal film. A setting value of reactive gas flow rate is controlled to enhance stability of deposition of the film. Temperature is set between 100° C.-200° C. to control the thickness A of the sputtering coating to be 1 micrometer (μm)-2 μm (which is exemplified as the optimum value), so that the film coating target material gets passivated on the resistance layer 14 to form a thin film composed of an oxide of silicon (Si), or a nitride of silicon (Si), or an oxide of tantalum (Ta). Such a film has a thickness A that is at least 1 micrometer and severs as a protection layer 2 having a property of resisting corrosion. As such, variations of electrical property of the thin film resistor 1 caused by electrolytic corrosion can be avoided. Further, the period of protection offered by the protection layer 2 is extended, as compared to a conventional protection layer made of an insulation material, such as epoxy) resin.

As shown in FIGS. 1 and 2, the thin film resistor 1 comprises, structurally, an aluminum oxide substrate 11, a first electrode section 12 formed at one side of the aluminum oxide substrate 11, a second electrode section 13 formed at one side of the aluminum oxide substrate 11 that is distant from the first electrode section, and a resistance layer 14 formed on the aluminum oxide substrate 11. The protection layer 2 formed through reactive sputtering is formed on the thin film resistor 1 and above the resistance layer 14 for protection of the resistance layer 14.

Tests have been conducted to demonstrate the effectiveness of the protection layer of the present invention. The tests are conducted as follows. Two thin film resistors of which one comprises a sputtered protection layer while the other does not. Water droplets are dropped on samples of the two thin film resistors and an electrical voltage of 20V is applied between electrodes on two opposite ends of each of the sample to observe the results of corrosion occurring in the resistance films. The results of the tests show that corrosion occurs in the resistance layer of the thin film resistor that has no protection layer, but not the thin film resistor including a protection layer according to the present invention. This evidences the protection layer provided by the present invention has effective protection.

It is however understood that the above only illustrates a preferred embodiment of the present invention and is not intended to impose undue limitations to the scope of the claims appended. Thus, simple modifications and equivalent structural variations based on the contents of the disclosure, as well as the attached drawings, are considered within the scope of protection of the claims.

Thus, the present invention provides a method for manufacturing an anticorrosive thin film resistor and a structure thereof, which involve the following technical features that achieve improvements over the prior art:

(1) An anticorrosive protection layer 2 is formed through sputtering on a surface of a resistance layer 14 to prevent quality change of the electrical resistance resulting from electrolytic corrosion.

(2) A protection layer 2 is formed with a film coating target that contains silicon (Si) or tantalum (Ta) and can provide a sustaining effect even for use in an extended period of time (3) Electrical property is not affected by operation temperature and the thickness A of the film so formed is more durable and useful for an extended time period.

It will be understood that each of the elements described above, or two or more together may also find a useful application in other types of methods differing from the type described above.

While certain novel features of this invention have been shown and described and are pointed out in the annexed claim, it is not intended to be limited to the details above, since it will be understood that various omissions, modifications, substitutions and changes in the forms and details of the device illustrated and in its operation can be made by those skilled in the art without departing in any way from the spirit of the present invention.

I claim:

1. A method for manufacturing an anticorrosive thin film resistor, comprising the following steps:
   (a) providing a thin film resistor comprising an aluminum oxide substrate, a first electrode section formed at one side of the aluminum oxide substrate, a second electrode section formed at one side of the aluminum oxide substrate that is distant from the first electrode section, and a resistance layer formed on the aluminum oxide substrate;
   (b) selecting one of silicon (Si) and tantalum (Ta) to serve as a film coating target;
   (c) mixing a reactive gas comprising one of oxygen and nitrogen in a discharge gas to conduct a reactive sputtering process with the film coating target;
   (d) controlling an operation temperature of the reactive sputtering process between 100° C.-500° C.; and
   (e) passivating the film coating target with the reactive gas so as to form an anticorrosive protection layer comprising a single chemical compound of the reactive gas and the film coating target on the resistance layer of the thin film resistor.

2. The method for manufacturing an anticorrosive thin film resistor according to claim 1, wherein the protection layer comprises a film formed of an oxide of silicon (Si), a nitride of silicon (Si), or an oxide of tantalum (Ta).

3. The method for manufacturing an anticorrosive thin film resistor according to claim 1, wherein the operation temperature of the reactive sputtering process is between 100° C.-200° C. and the protection layer has a thickness between 1 μm-2 μm.

4. A structure of an anticorrosive thin film resistor, comprising:
   a thin film resistor comprising an aluminum oxide substrate, a first electrode section formed at one side of the aluminum oxide substrate, a second electrode section formed at one side of the aluminum oxide substrate that is distant from the first electrode section, and a resistance layer formed on the aluminum oxide substrate; and
   a protection layer formed on the resistance layer of the thin film resistor to prevent change of electrical property of the resistor resulting from electrolytic corrosion, the protection layer being formed by passivating a film coating target material of at least one silicon (Si) or tantalum (Ta) with a reactive sputtering process involving a reactive gas comprising one of oxygen and nitrogen.

5. The structure of the anticorrosive thin film resistor according to claim 4, wherein the reactive sputtering process is conducted an operation temperature between 100° C.-500° C.

6. The structure of the anticorrosive thin film resistor according to claim 5, wherein the protection layer comprises a film formed of an oxide of silicon (Si), a nitride of silicon (Si), or an oxide of tantalum (Ta).

7. The structure of the anticorrosive thin film resistor according to claim 5, wherein the operation temperature of the reactive sputtering process is between 100° C.-200° C. and the protection layer has a thickness between 1 μm-2 μm.

* * * * *